(12) United States Patent
Jeong et al.

(10) Patent No.: US 10,714,556 B2
(45) Date of Patent: Jul. 14, 2020

(54) TRANSISTOR SUBSTRATE AND DISPLAY DEVICE INCLUDING THE SAME

(71) Applicant: SAMSUNG DISPLAY CO., LTD., Yongin-si (KR)

(72) Inventors: Woong Hee Jeong, Yongin-si (KR); Tae Hoon Yang, Yongin-si (KR); Jong Chan Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/296,755

(22) Filed: Mar. 8, 2019

(65) Prior Publication Data
US 2019/0280072 A1 Sep. 12, 2019

(30) Foreign Application Priority Data
Mar. 9, 2018 (KR) .................... 10-2018-0028239

(51) Int. Cl.
*H01L 27/32* (2006.01)
*G09G 3/3233* (2016.01)
*H01L 27/12* (2006.01)

(52) U.S. Cl.
CPC ....... *H01L 27/3262* (2013.01); *G09G 3/3233* (2013.01); *H01L 27/3223* (2013.01); *H01L 27/3258* (2013.01); *G09G 2300/0426* (2013.01); *G09G 2300/08* (2013.01); *H01L 27/124* (2013.01); *H01L 27/1248* (2013.01); *H01L 27/3248* (2013.01); *H01L 27/3276* (2013.01)

(58) Field of Classification Search
CPC ............. H01L 27/3262; H01L 27/3223; H01L 27/3258; H01L 27/124; H01L 27/1248; H01L 27/3248; H01L 27/3276; G09G 3/3233; G09G 2300/0426; G09G 2300/08
USPC ........................................ 257/40; 438/82, 99
See application file for complete search history.

(56) References Cited

U.S. PATENT DOCUMENTS

| | | | |
|---|---|---|---|
| 9,759,941 B2 | 9/2017 | Yang | |
| 2015/0102350 A1* | 4/2015 | So | H01L 27/1237 257/71 |
| 2016/0233253 A1* | 8/2016 | Kim | H01L 27/1248 |
| 2017/0165347 A1 | 6/2017 | Li | |
| 2017/0243943 A1 | 8/2017 | Won et al. | |

* cited by examiner

*Primary Examiner* — Didarul A Mazumder
(74) *Attorney, Agent, or Firm* — F. Chau & Associates, LLC

(57) ABSTRACT

A transistor substrate may include a base substrate, and a switching transistor and a driving transistor provided on the base substrate. The driving transistor includes: an active pattern provided on the base substrate and including a source region, a drain region spaced apart from the source region, and a channel region provided between the source region and the drain region; a gate electrode at least partially overlapping the active pattern; a gate insulating film provided between the active pattern and the gate electrode; a source electrode insulated from the gate electrode and connected to the source region; a drain electrode insulated from the gate electrode and connected to the drain region; and at least one dummy hole adjacent to the channel region.

18 Claims, 9 Drawing Sheets

TRANSISTOR SUBSTRATE AND DISPLAY DEVICE INCLUDING THE SAME

CROSS-REFERENCE TO RELATED APPLICATION

The present application claims priority under 35 U.S.C. § 119(a) to Korean patent application 10-2018-0028239, filed on Mar. 9, 2018 in the Korean Intellectual Property Office, the disclosure of which is incorporated by reference herein in its entirety.

TECHNICAL FIELD

Exemplary embodiments of the inventive concept relate to a transistor substrate and a display device including the transistor substrate.

DISCUSSION OF RELATED ART

An organic light emitting display includes two electrodes and a light emitting layer disposed between the two electrodes. Electrons injected from one electrode and holes injected from another electrode are combined in the light emitting layer to form excitons. The excitons emit energy and emit light.

Organic light emitting displays are a type of flat panel display having a small thickness, a wide viewing angle, and a high response speed. Organic light emitting displays may be classified into passive matrix organic light emitting (PMOLED) displays and active matrix organic light emitting (AMOLED) displays according to a driving method thereof. Active matrix organic light emitting displays have a structure in which an electrode and a light emitting layer are formed on a thin film transistor display panel. The thin film transistor display panel includes a signal line, a switching transistor connected to the signal line for controlling a data voltage, and a driving transistor for applying the data voltage, received from the switching transistor, to a gate voltage to supply a current to a light emitting element.

SUMMARY

According to an exemplary embodiment of the inventive concept, a transistor substrate includes a base substrate, and a switching transistor and a driving transistor provided on the base substrate. The driving transistor includes: an active pattern provided on the base substrate and including a source region, a drain region spaced apart from the source region, and a channel region provided between the source region and the drain region; a gate electrode at least partially overlapping the active pattern; a gate insulating film provided between the active pattern and the gate electrode; a source electrode insulated from the gate electrode and connected to the source region; a drain electrode insulated from the gate electrode and connected to the drain region; and at least one dummy hole adjacent to the channel region.

In an exemplary embodiment of the inventive concept, the driving transistor further includes a first insulating film disposed on the gate electrode, And the at least one dummy hole penetrates at least one of the gate insulating film and the first insulating film.

In an exemplary embodiment of the inventive concept, the at least one dummy hole is spaced apart from the channel region by a dummy interval, and the dummy interval is a distance between the channel region and the at least one dummy hole.

In an exemplary embodiment of the inventive concept, the at least one dummy hole includes at least two dummy holes, and the dummy interval is different for each of the at least two dummy holes.

In an exemplary embodiment of the inventive concept, the at least one dummy hole includes at least two dummy holes, and the dummy interval is the same for each of the at least two dummy holes.

In an exemplary embodiment of the inventive concept, as the dummy interval decreases, an S-factor of the driving transistor increases.

In an exemplary embodiment of the inventive concept, as a number of the at least one dummy hole increases, an S-factor of the driving transistor increases.

In an exemplary embodiment of the inventive concept, the at least one dummy hole is formed of substantially the same material as at least one of the source electrode and the drain electrode.

According to an exemplary embodiment of the inventive concept, a display device includes an organic light emitting diode, a driving transistor configured to control an amount of current supplied to the organic light emitting diode, a switching transistor configured to transmit a data signal to the driving transistor, and at least one dummy hole, where the at least one dummy hole is disposed adjacent to the driving transistor.

In an exemplary embodiment of the inventive concept, the driving transistor includes: an active pattern disposed on a substrate and including a source region, a drain region, and a channel region; a gate electrode overlapping the channel region; and a gate insulating film disposed between the active pattern and the gate electrode.

In an exemplary embodiment of the inventive concept, the driving transistor further includes a first insulating film disposed on the gate electrode, and the at least one dummy hole penetrates at least one of the gate insulating film and the first insulating film.

In an exemplary embodiment of the inventive concept, the at least one dummy hole is spaced apart from the channel region by a dummy interval, and the dummy interval is a distance between the channel region and the at least one dummy hole.

In an exemplary embodiment of the inventive concept, the at least one dummy hole includes at least two dummy holes, and the dummy interval is different for each of the at least two dummy holes.

In an exemplary embodiment of the inventive concept, the at least one dummy hole includes at least two dummy holes, and the dummy interval is the same for each of the at least two dummy holes.

According to an exemplary embodiment of the inventive concept, a transistor substrate includes: a base substrate; a first transistor provided on the base substrate and including a first gate electrode, a first active pattern, a first source electrode, and a first drain electrode, where the first active pattern contacts the base substrate; a first insulating film provided between the first active pattern and the first gate electrode; and a second insulating film provided on the first gate electrode. At least one dummy hole is provided adjacent to the first transistor and penetrates the first insulating film and the second insulating film.

In an exemplary embodiment of the inventive concept, the transistor substrate further includes a third insulating film provided on the first source electrode and the first drain electrode. The third insulating film is a passivation film or a planarizing film.

In an exemplary embodiment of the inventive concept, the transistor substrate further includes an organic light emitting diode provided on the third insulating film and including a first electrode, a second electrode, and a light emission layer provided between the first electrode and the second electrode.

In an exemplary embodiment of the inventive concept, the first active pattern includes a first channel region, a first source region, and a first drain region. The at least one dummy hole is spaced apart from the first channel region by a dummy interval that is a distance between the first channel region and the at least one dummy hole.

In an exemplary embodiment of the inventive concept, the transistor substrate further includes a second transistor. The first transistor is a driving transistor and the second transistor is a switching transistor. The at least one dummy hole is provided closer to the first transistor than the second transistor.

In an exemplary embodiment of the inventive concept, an S-factor of the first transistor is greater than an S-factor of the second transistor.

BRIEF DESCRIPTION OF THE DRAWINGS

The above and other features of the inventive concept will be more fully understood by describing in detail exemplary embodiments thereof with reference to the accompanying drawings.

DETAILED DESCRIPTION OF THE EMBODIMENTS

Figure 1:
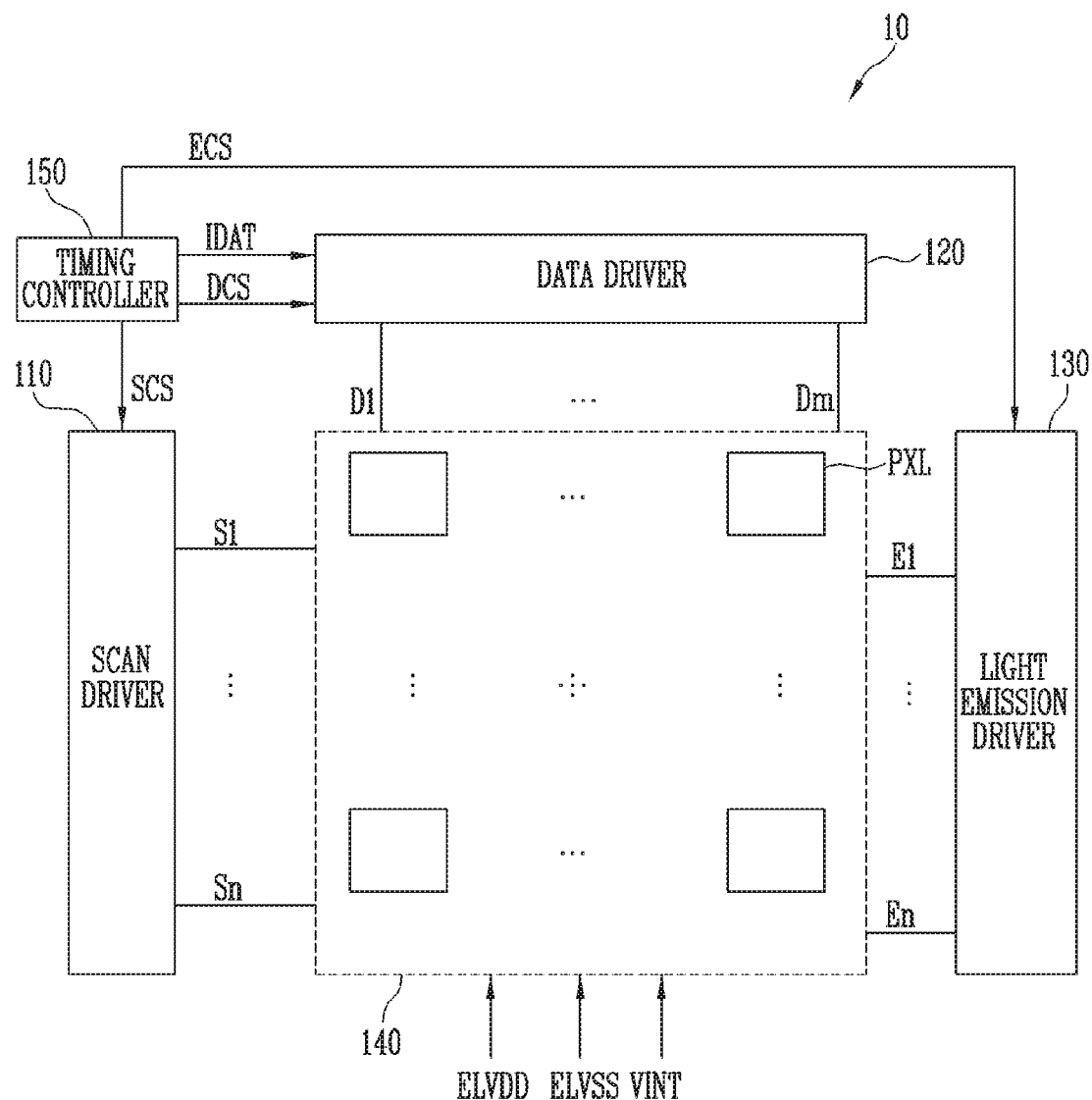
FIG. 1 is a diagram illustrating a display device according to an exemplary embodiment of the inventive concept.

Exemplary embodiments of the inventive concept provide a transistor substrate and a display device having the transistor substrate that can improve the characteristics of a driving transistor.

Exemplary embodiments of the inventive concept will be described more fully hereinafter with reference to the accompanying drawings. Like reference numerals refer to like elements throughout this application.

The thicknesses, ratios, and dimensions of elements may be exaggerated in the drawings for clarity. Moreover, spatially relative terms, such as "beneath," "below," "lower," "above," "upper," and the like may be used herein for ease of description to describe one element's spatial relationship to another element(s) as illustrated in the drawings. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the entire specification, when an element is referred to as being "connected" or "coupled" to another element, it can be directly connected or coupled to the another element or be indirectly connected or coupled to the another element with one or more intervening elements interposed therebetween.

FIG. 1 is a diagram illustrating a display device according to an exemplary embodiment of the inventive concept.

Referring FIG. 1, a display device 10 according to an exemplary embodiment of the inventive concept may include a scan driver 110, a data driver 120, a light emission driver 130, a pixel unit 140 including pixels PXL, and a timing controller 150.

The pixels PXL may be connected to scan lines S1 to Sn, emission control lines E1 to En, and data lines D1 to Dm.

In addition, the pixels PXL may be connected to a first power source ELVDD, a second power source ELVSS, and a third power source VINT.

For convenience of explanation, the specific connection relationship between the pixels PXL and the scan lines S1 to Sn, the emission control lines E1 to En, and the data lines D1 to Dm is omitted in FIG. 1.

The pixels PXL may be supplied with scan signals from the scan lines S1 to Sn and may be supplied with data signals synchronized with the scan signals from the data lines D1 to Dm.

The pixels PXL supplied with the data signals may control the amount of driving current flowing from the first power source ELVDD to the second power source ELVSS through an organic light emitting diode. The organic light emitting diode may generate light of a luminance corresponding to the amount of the driving current.

Further, each of the pixels PXL may be connected to a plurality of scan lines. For example, each of the pixels PXL may be connected to the current scan line, the previous scan line, and the next scan line. In other words, the pixels PXL located on an i-th horizontal line may be connected to an i-th scan line Si, an (i−1)-th scan line Si−1, and an (i+1)-th scan line Si+1. However, the connection relationship between the pixels PXL and the scan lines S1 to Sn may be variously modified depending on the structure of the pixels PXL.

The scan driver 110 may supply the scan signals to the scan lines S1 to Sn corresponding to a scan driver control signal SCS from the timing controller 150. For example, the scan driver 110 may sequentially supply the scan signals to the scan lines S1 to Sn. When the scan signals are sequentially supplied to the scan lines S1 to Sn, the pixels PXL may be sequentially selected in units of horizontal lines. The scan signals may have a voltage level at which the transistors receiving the scan signals may be turned on.

The light emission driver 130 may supply emission control signals to the emission control lines E1 to En corresponding to an emission driver control signal ECS from the timing controller 150. For example, the light emission driver 130 may sequentially supply the emission control signals to the emission control lines E1 to En. The emission control signals may have a voltage level at which the transistors receiving the emission control signals may be turned off.

The data driver 120 may supply the data signals to the data lines D1 to Dm in response to a data driver control signal DCS.

The data signals supplied to the data lines D1 to Dm may be supplied to the pixels PXL selected by the respective scan signals.

To this end, the data driver 120 may supply the data signals to the data lines D1 to Dm in synchronization with the scan signals.

The timing controller 150 may generate the data driver control signal DCS, the scan driver control signal SCS, and the emission driver control signal ECS in response to control signals supplied from the outside.

The scan driver control signal SCS may be supplied to the scan driver 110, the data driver control signal DCS may be supplied to the data driver 120, and the emission driver control signal ECS may be supplied to the light emission driver 130.

In addition, the timing controller 150 may convert image data input from the outside into image data IDAT conforming to the specifications of the data driver 120, and may supply the image data IDAT to the data driver 120.

The scan driver control signal SCS may include a scan start signal and clock signals. The scan start signal may control the supply timing of the scan signals, and the clock signals may be used to shift the scan start signal.

The emission driver control signal ECS may include an emission start signal and clock signals. The emission start signal may control the supply timing of the emission control signals, and the clock signals may be used to shift the emission start signal.

The data driver control signal DCS may include a source start signal, a source output enable signal, a source sampling clock, and the like. The source start signal may control a data sampling start timing of the data driver 120. The source sampling clock may control a sampling operation of the data driver 120 according to a rising or falling edge of the source sampling clock. The source output enable signal may control an output timing of the data driver 120.

Although n scan lines (S1 through Sn) and n emission control lines (E1 through En) are shown in FIG. 1, the inventive concept is not limited thereto. For example, dummy scan lines and/or dummy emission control lines may be additionally formed for driving stability.

Although the scan driver 110, the data driver 120, the light emission driver 130, and the timing controller 150 are separately shown in FIG. 1, at least some of the components may be integrated as needed.

The scan driver 110, the data driver 120, the light emission driver 130, and the timing controller 150 may be formed as a chip on glass, a chip on plastic, a tape carrier package, a chip on film, or the like.

Figure 2A:
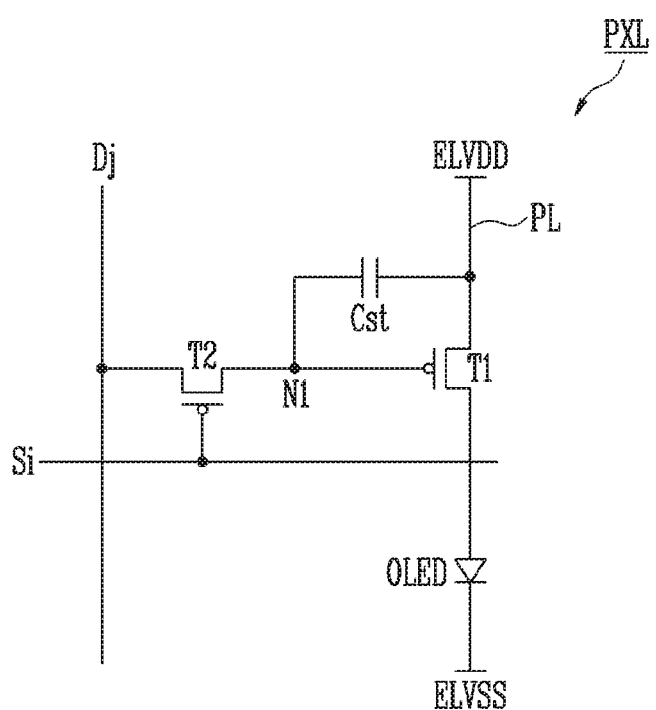
FIGS. 2A and 2B are diagrams illustrating a pixel according to exemplary embodiments of the inventive concept.
Figure 2B:
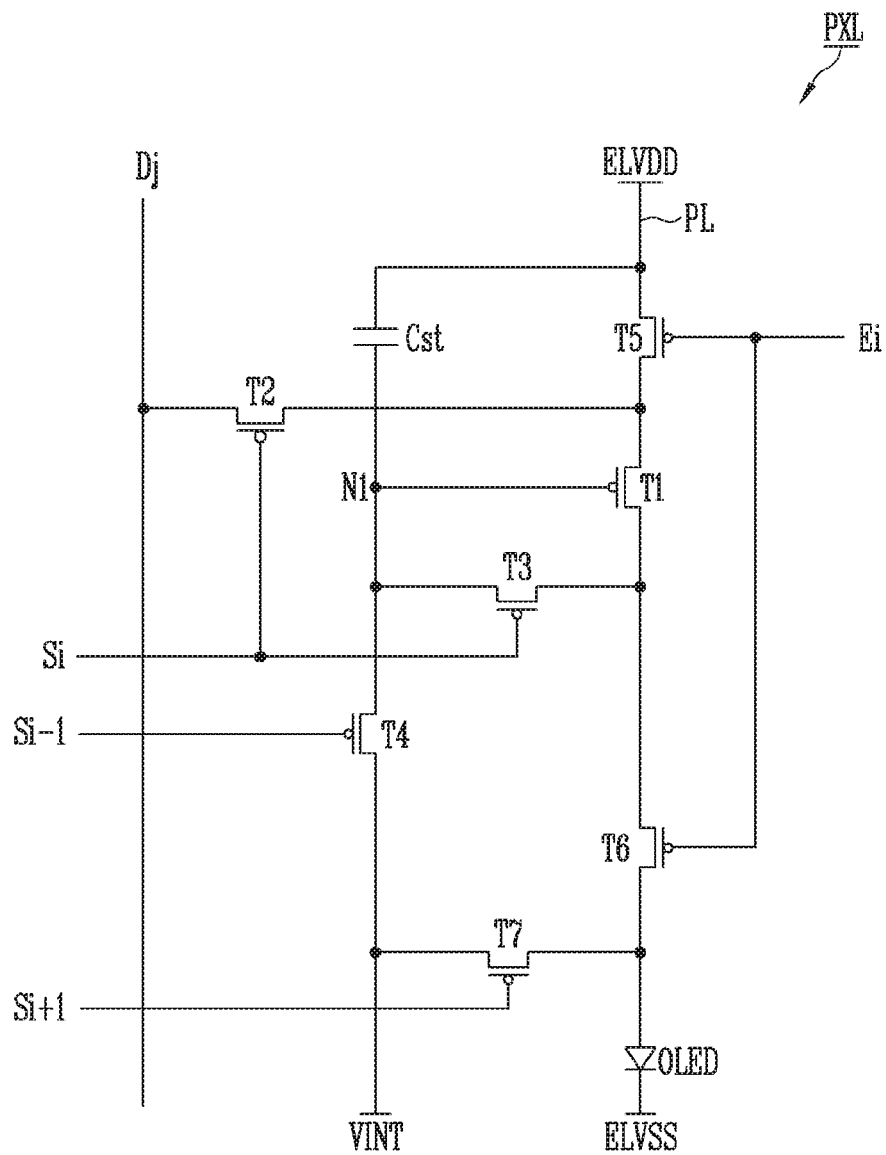

FIGS. 2A and 2B are diagrams illustrating a pixel according to exemplary embodiments of the inventive concept.

For convenience, FIGS. 2A and 2B show a pixel arranged in an i-th (where i is a natural number) row and a j-th (where j is a natural number) column in a pixel unit.

In FIGS. 2A and 2B, the i-th scan line Si may be the current scan line for supplying the scan signal to the pixels of the i-th row.

In FIG. 2B, the remaining scan lines Si−1 and Si+1 connected to the pixel are used as an initialization control line for controlling initialization.

The initialization control line may be the current scan line for the pixels of the adjacent rows, for example, the pixels of the (i−1)-th row and the (i+1)-th row.

For convenience, the current scan line in the (i−1)-th row is hereinafter referred to as the (i−1)-th scan line Si−1. The current scan line in the i-th row is referred to as the i-th scan line Si. The current scan line in the (i+1)-th row is referred to as the (i+1)-th scan line Si+1. The emission control line of the i-th row is referred to as an emission control line Ei. The data line in the j-th column is referred to as a data line Dj.

A power line of the j-th column, for example, the power line of the j-th column to which the first power source ELVDD is applied, is referred to as a power line PL.

Referring to FIG. 2A, the pixel PXL according to an exemplary embodiment of the inventive concept may include a display element (the organic light emitting diode OLED), a first transistor T1, a second transistor T2, and a storage capacitor Cst. In this specification, a display element is typically described as the organic light emitting diode OLED, but the inventive concept is not limited thereto.

An anode electrode of the organic light emitting diode OLED may be connected to the first transistor T1, and a cathode electrode of the organic light emitting diode OLED may be connected to the second power source ELVSS. The organic light emitting diode OLED may generate light of a predetermined luminance corresponding to the amount of current supplied from the first transistor T1.

The voltage value of the first power source ELVDD may be set to be higher than the voltage value of the second power source ELVSS so that current may flow through the organic light emitting diode OLED.

A first electrode of the first transistor T1 (e.g., a driving transistor) may be connected to the first power source ELVDD, and a second electrode of the first transistor T1 may be connected to the anode electrode of the organic light emitting diode OLED. A gate electrode of the first transistor T1 may be connected to a first node N1.

The first transistor T1 may control the amount of current flowing from the first power source ELVDD to the second power source ELVSS through the organic light emitting diode OLED in response to the voltage of the first node N1.

A second transistor T2 (e.g., the switching transistor) may be connected between the data line Dj and the first node N1. A gate electrode of the second transistor T2 may be connected to the i-th scan line Si.

The second transistor T2 may be turned on when the scan signal is supplied to the i-th scan line Si to electrically connect the data line Dj and the first electrode of the first transistor T1.

In other words, the second transistor T2 may transmit the data signal, applied to the data line Dj, to the first transistor T1 according to the scan signal applied to the scan line Si.

The storage capacitor Cst may be connected between the first power source ELVDD and the first node N1. The storage capacitor Cst may store the data signal and a voltage corresponding to a threshold voltage of the first transistor T1.

Referring to FIG. 2B, the pixel PXL according to an exemplary embodiment of the inventive concept may include the organic light emitting diode OLED, first through seventh transistors T1 through T7, and the storage capacitor Cst.

An anode electrode of the organic light emitting diode OLED may be connected to the first transistor T1 through the sixth transistor T6 and a cathode electrode of the organic light emitting diode OLED may be connected to the second power source ELVSS. The organic light emitting diode OLED may generate light of a predetermined luminance corresponding to the amount of current supplied from the first transistor T1. The voltage value of the first power source ELVDD may be set to be higher than the voltage value of the second power source ELVSS so that current may flow through the organic light emitting diode OLED.

A first electrode of the first transistor T1 (e.g., the driving transistor) may be connected to the first power source ELVDD through the fifth transistor T5, and a second electrode of the first transistor T1 may be connected to the anode electrode of the organic light emitting diode OLED through the sixth transistor T6. A gate electrode of the first transistor T1 may be connected to the first node N1.

The first transistor T1 may control the amount of current flowing from the first power source ELVDD to the second power source ELVSS through the organic light emitting diode OLED in response to the voltage of the first node N1.

Hereinafter, the second to seventh transistors T2 to T7 may be switching transistors.

The second transistor T2 may be connected between the data line Dj and the first electrode of the first transistor T1. A gate electrode of the second transistor T2 may be connected to the i-th scan line Si.

The second transistor T2 may be turned on when the scan signal is supplied to the i-th scan line Si to electrically connect the data line Dj and the first electrode of the first transistor T1.

The third transistor T3 may be connected between the second electrode of the first transistor T1 and the first node N1. A gate electrode of the third transistor T3 may be connected to the i-th scan line Si.

The third transistor T3 may be turned on when the scan signal is supplied to the i-th scan line Si to electrically connect the second electrode of the first transistor T1 and the first node N1. Therefore, when the third transistor T3 is turned on, the first transistor T1 may be connected in a diode form.

The fourth transistor T4 may be connected between the first node N1 and the third power source VINT. A gate electrode of the fourth transistor T4 may be connected to the (i−1)-th scan line Si−1.

The fourth transistor T4 may be turned on when the scan signal is supplied to the (i−1)-th scan line Si−1 to supply a voltage of the third power source VINT to the first node N1.

Although the present exemplary embodiment uses the (i−1)-th scan line Si−1 as the initialization control line for initializing the gate node of the first transistor T1, e.g., the first node N1, the inventive concept is not limited thereto.

For example, in an exemplary embodiment of the inventive concept, another control line such as the (i−2)-th scan line Si−2 may be used as the initialization control line for initializing the gate node of the first transistor T1.

The fifth transistor T5 may be connected between the first power source ELVDD and the first transistor T1. A gate electrode of the fifth transistor T5 may be connected to the emission control line Ei.

The fifth transistor T5 may be turned off when the emission control signal is supplied to the emission control line Ei, and the fifth transistor T5 may be turned on when the emission control signal is not supplied to the emission control line Ei.

The sixth transistor T6 may be connected between the first transistor T1 and the organic light emitting diode OLED. A gate electrode of the sixth transistor T6 may be connected to the emission control line Ei.

The sixth transistor T6 may be turned off when the light emission control signal (e.g., the emission control signal having a gate off voltage (high level voltage)) is supplied to the emission control line Ei, and the sixth transistor T6 may be turned on when the emission control signal is not supplied to the emission control line Ei.

The seventh transistor T7 may be connected between the third power source VINT and the anode electrode of the organic light emitting diode OLED. A gate electrode of the seventh transistor T7 may be connected to the (i+1)-th scan line Si+1.

The seventh transistor T7 may be turned on when the scan signal is supplied to the (i+1)-th scan line Si+1, and the voltage of the third power source VINT may be applied to the anode electrode of the organic light emitting diode OLED.

The voltage of the third power source VINT may be set to a voltage lower than the data signal. In other words, the voltage of the third power source VINT may be set to be less than or equal to the lowest voltage of the data signal.

In the present exemplary embodiment of the inventive concept, the (i+1)-th scan line Si+1 is an anode initialization control line to which a gate electrode of the seventh transistor T7 is connected. However, this is merely exemplary, and the inventive concept is not limited thereto.

For example, In an exemplary embodiment of the inventive concept, the gate electrode of the seventh transistor T7 may be connected to the i-th scan line Si. The voltage of the third power source VINT may be supplied to the anode electrode of the organic light emitting diode OLED through the seventh transistor T7 when the scan signal is supplied to the i-th scan line Si.

The storage capacitor Cst may be connected between the first power source ELVDD and the first node N1. The storage capacitor Cst may store the data signal and a voltage corresponding to a threshold voltage of the first transistor T1.

The structure of the pixel PXL is not limited to the exemplary embodiment shown in FIG. 2B. For example, pixel circuits of various structures may also be applicable to the pixel PXL.

Figure 3:
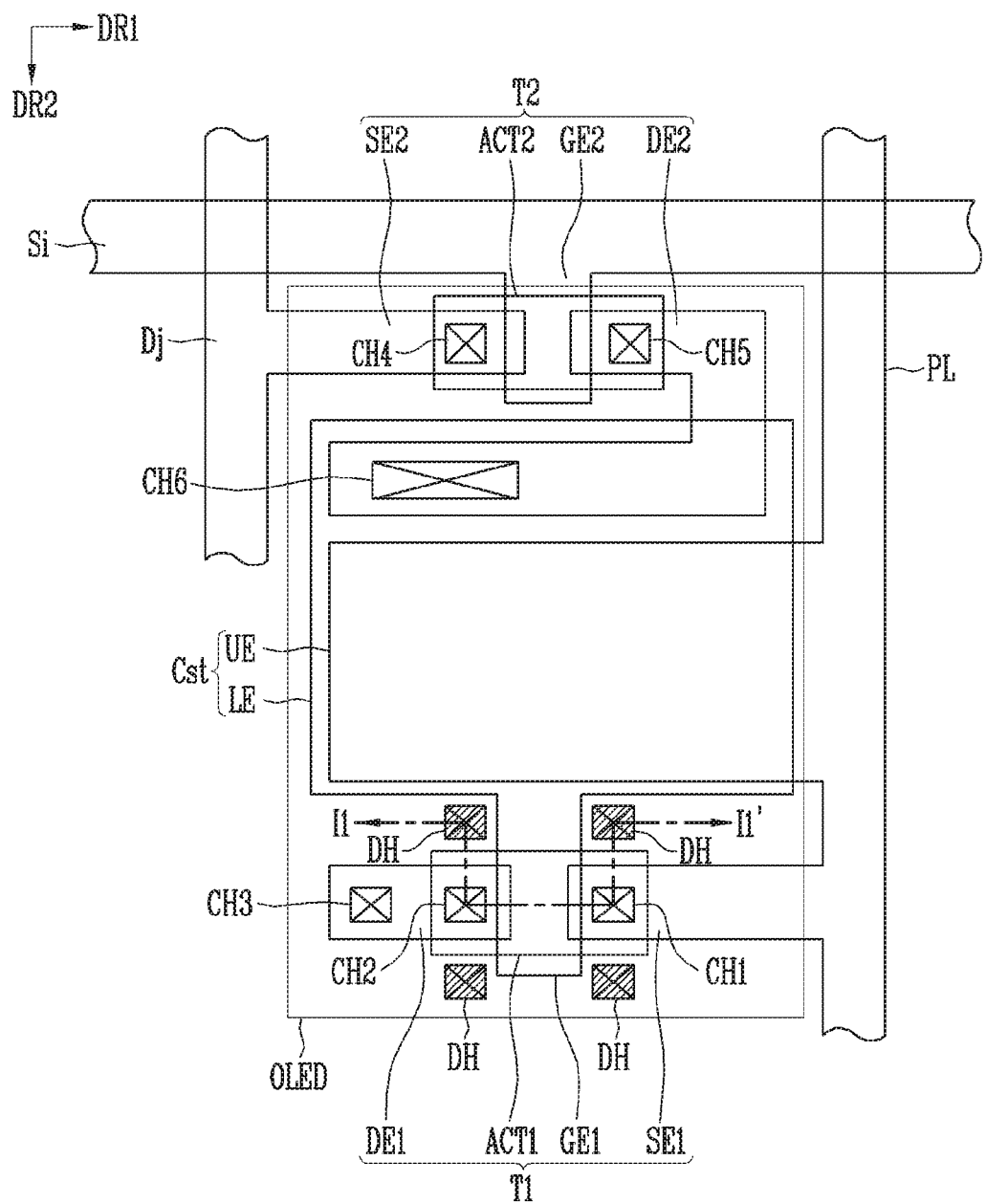
FIG. 3 is a diagram illustrating a transistor substrate according to an exemplary embodiment of the inventive concept.

FIG. 3 is a diagram illustrating a transistor substrate according to an exemplary embodiment of the inventive concept. Particularly, FIG. 3 is a plan diagram illustrating a detailed layout of the pixel shown in FIG. 2A.

Figure 4:
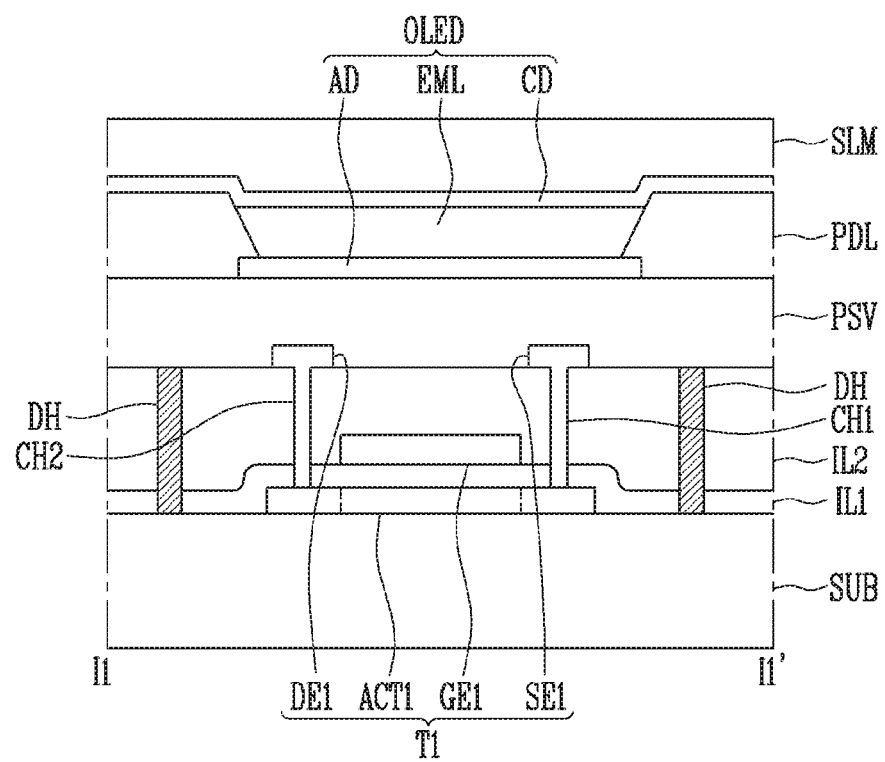
FIG. 4 is a cross-sectional diagram of the transistor substrate shown in FIG. 3 taken along line I1-I1' according to an exemplary embodiment of the inventive concept.

FIG. 4 is a cross-sectional diagram of the transistor substrate shown in FIG. 3 taken along line I1-I1'.

Figure 5:
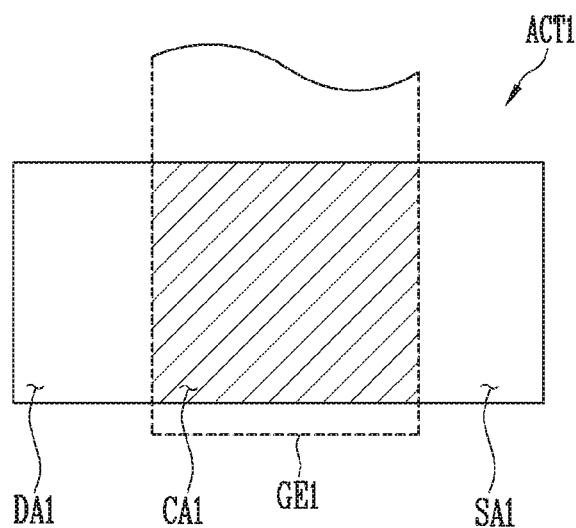
FIG. 5 is a detailed diagram illustrating an active pattern shown in FIG. 3 according to an exemplary embodiment of the inventive concept.

FIG. 5 is a detailed diagram illustrating an active pattern shown in FIG. 3. In particular, FIG. 5 is a diagram illustrating in detail a first active pattern ACT1 shown in FIG. 3.

Referring to FIGS. 3 to 5, a display device according to an exemplary embodiment of the inventive concept may include a transistor substrate, and the transistor substrate may include a base substrate SUB, a wiring unit, and the pixels PXL.

The wiring unit may supply driving signals and/or power to each of the pixels PXL. According to an exemplary embodiment of the inventive concept, the wiring unit may include the scan line Si, the data line Dj, and the power line PL.

The scan line Si may extend in a first direction DR1 and may receive a scan signal. For example, the scan line Si may receive the i-th scan signal.

The data line Dj may extend in a second direction DR2 different from the first direction DR1. For example, the data line Dj may extend in the direction crossing the scan line Si. The data line Dj may receive a data signal.

The power line PL may extend along the second direction DR2, but is not limited thereto. The power line PL may be arranged to be spaced apart from the data line Dj and may receive the first power source ELVDD.

According to an exemplary embodiment of the inventive concept, each pixel PXL may include the first transistor T1, the second transistor T2, the storage capacitor Cst, and the organic light emitting diode OLED.

The first transistor T1 may include a first gate electrode GE1, the first active pattern ACT1, a first source electrode SE1, and a first drain electrode DEE The first gate electrode GE1 may be electrically connected to a second drain electrode DE2 of the second transistor T2 and a lower electrode LE of the storage capacitor Cst. According to an exemplary embodiment of the inventive concept, the first gate electrode GE1 may be provided as a part of the lower electrode LE, or may protrude from the lower electrode LE.

The first active pattern ACT1 may be formed of a semiconductor layer not doped with an impurity or doped with an impurity. In other words, as shown in FIG. 5, the first active pattern ACT1 may include a first channel region CAL a first source region SA1, and a first drain region DA1. The first source region SA1 and the first drain region DA1 may be formed of a semiconductor layer doped with an impurity and the first channel region CA1 may be a semiconductor layer not doped with an impurity.

According to an exemplary embodiment of the inventive concept, the first active pattern ACT1 may be formed in the shape of a bar extending in a predetermined direction. For example, the first channel region CA1 may overlap with the first gate electrode GE1.

The above-described feature of the first active pattern ACT1 may also be applied to a second active pattern ACT2 of the second transistor T2.

The first source electrode SE1 may be connected to the first source region SA1 of the first active pattern ACT1 through a first contact hole CH1. The first source electrode SE1 may be connected to the power line PL. According to an exemplary embodiment of the inventive concept, the first source electrode SE1 may be provided as a part of the power line PL or may protrude from the power line PL.

The first drain electrode DE1 may be connected to the first drain region DA1 of the first active pattern ACT1 through a second contact hole CH2. The first drain electrode DE1 may also be connected to the organic light emitting diode OLED through a third contact hole CH3.

The second transistor T2 may include a second gate electrode GE2, the second active pattern ACT2, a second source electrode SE2, and the second drain electrode DE2.

The second gate electrode GE2 may be connected to the scan line Si. According to an exemplary embodiment of the inventive concept, the second gate electrode GE2 may be provided as a part of the scan line Si or may protrude from the scan line Si.

The second active pattern ACT2 may be formed of a semiconductor layer which is not doped with an impurity or is doped with an impurity. In other words, the second active pattern ACT2 may include a second channel region, a second source region, and a second drain region. The second source region and the second drain region may be formed of a semiconductor layer doped with an impurity and the second channel region may be formed of a semiconductor layer not doped with an impurity.

According to an exemplary embodiment of the inventive concept, the second active pattern ACT2 may be formed in the shape of a bar extending in a predetermined direction.

The second source electrode SE2 may be connected to the second source region of the second active pattern ACT2 through a fourth contact hole CH4. In addition, the second source electrode SE2 may be connected to the data line Dj.

According to an exemplary embodiment of the inventive concept, the second source electrode SE2 may be provided as a part of the data line Dj or may protrude from the data line Dj.

The second drain electrode DE2 may be connected to the second drain region of the second active pattern ACT2 through a fifth contact hole CH5. The second drain electrode DE2 may be connected to the lower electrode LE of the storage capacitor Cst through a sixth contact hole CH6.

The storage capacitor Cst may include the lower electrode LE and an upper electrode UE.

The lower electrode LE may be connected to the first gate electrode GE1 of the first transistor T1.

The upper electrode UE may overlap with the lower electrode LE when viewed in a plan view. The capacitance of the storage capacitor Cst may be increased by widening the overlapping area of the upper electrode UE and the lower electrode LE. The upper electrode UE may be connected to the power line PL. According to an exemplary embodiment of the inventive concept, the upper electrode UE may be provided as a part of the power line PL or may protrude from the power line PL.

According to an exemplary embodiment of the inventive concept, each pixel PXL may include at least one dummy hole DH.

In FIG. 3, four dummy holes DH are shown, but the inventive concept is not limited thereto. According to an exemplary embodiment of the inventive concept, the number of dummy holes DH may five or more, or three or less.

At least one dummy hole DH may be located adjacent to the first active pattern ACT1 of the first transistor T1. In other words, at least one dummy hole DH may be positioned adjacent to the first channel region CAE For example, at least one dummy hole DH may be located closer to the first transistor T1 than the second transistor T2.

Referring to FIGS. 3 and 4, an active pattern layer may be disposed on the base substrate SUB. According to an exemplary embodiment of the inventive concept, the active pattern layer may be provided with the active patterns ACT1 and ACT2 (hereinafter referred to as ACT).

According to an exemplary embodiment of the inventive concept, the active patterns ACT may include the first active pattern ACT1 and the second active pattern ACT2. The first active pattern ACT1 and the second active pattern ACT2 may be formed of a semiconductor material.

According to an exemplary embodiment of the inventive concept, a buffer layer may be provided between the base substrate SUB and the active patterns ACT.

A first insulating film IL1 may be provided on the base substrate SUB. The first insulating film IL1 may be a gate insulating film interposed between the active patterns ACT and the gate electrodes of the transistors included in the pixels PXL.

According to an exemplary embodiment of the inventive concept, the first insulating film IL1 may include one or more inorganic films and/or organic films. For example, the first insulating film IL1 may be formed of an inorganic film containing SiOx, SiNx, or the like, but is not limited thereto. For example, the first insulating film IL1 may include an inorganic insulating material or an organic insulating material such as SiOx, SiNx, SiON, SiOF, AlOx, or the like, and may be a single layer or a multi-layer.

A first conductive layer may be disposed on the first insulating film IL1.

The lower electrode LE of the storage capacitor Cst, the scan line Si, the first gate electrode GE1 and the second gate electrode GE2 may be provided in the first conductive layer.

According to an exemplary embodiment of the inventive concept, the first gate electrode GE1 and the lower electrode LE may be integrally formed. According to an exemplary embodiment of the inventive concept, the second gate electrode GE2 may be formed integrally with the scan line Si.

The lower electrode LE of the storage capacitor Cst, the scan line Si, the first gate electrode GE1 and the second gate electrode GE2 disposed in the first conductive layer may be made of substantially the same material. For example, the lower electrode LE of the storage capacitor Cst, the scan line Si, the first gate electrode GE1, and the second gate electrode GE2 may be formed of a predetermined first metal.

The first metal may be at least one selected from the group consisting of Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, and Pb. In addition, various other metals may be used.

The first metal may be at least one alloy selected from the group consisting of MoTi and AlNiLa. In addition, various other alloys may be used.

A multi-film that may constitute the first metal may be at least one selected from the group consisting of Ti/Cu, Ti/Au, Mo/Al/Mo, ITO/Ag/ITO, TiN/Ti/Al/Ti, and TiN/Ti/Cu/Ti. In addition, various multi-layered conductive materials may be used.

However, the constituent materials of the lower electrode LE, the scan line Si, the first gate electrode GE1, and the second gate electrode GE2 are not limited to metal.

In other words, any material that can provide enough conductivity to drive the pixels PXL may be used to constitute the lower electrode LE, the scan line Si, the first gate electrode GE1, and the second gate electrode GE2.

A second insulating film IL2 may be provided on the first conductive layer.

According to an exemplary embodiment of the inventive concept, the second insulating film IL2 may include one or more inorganic films and/or organic films. For example, the second insulating film IL2 may be formed of an inorganic film containing SiOx, SiNx, or the like, but is not limited thereto. For example, the second insulating film IL2 may include an inorganic insulating material or an organic insulating material such as SiOx, SiNx, SiON, SiOF, AlOx, or the like, and may be a single layer or a multi-layer.

A second conductive layer may be disposed on the second insulating film IL2.

The data line Dj, the power line PL, the upper electrode UE of the storage capacitor Cst, the first source electrode SE1, and the first drain electrode DE1 may be provided in the second conductive layer.

The upper electrode UE may overlap the lower electrode LE. The upper electrode UE overlaps the lower electrode LE with the first insulating film IL1 sandwiched therebetween, so that the upper electrode UE and the lower electrode LE may form the storage capacitor Cst.

The data line Dj, the power line PL, the upper electrode UE of the storage capacitor Cst, the first source electrode SE1, and the first drain electrode DE1 disposed in the second conductive layer may be made of substantially the same material.

For example, the data line Dj, the power line PL, the upper electrode UE, the first source electrode SE1, and the first drain electrode DE1 may be formed of a predetermined second metal. According to an exemplary embodiment of the inventive concept, the second metal may be, but is not limited to, one of the metals previously presented as an example of the first metal.

However, the materials of the data line Dj, the power line PL, the upper electrode UE, the first source electrode SE1, and the first drain electrode DE1 disposed in the second conductive layer are not limited to metal.

In other words, any material that can provide enough conductivity to drive the pixels PXL may be used to constitute the data line Dj, the power line PL, the upper electrode UE, the first source electrode SE1, and the first drain electrode DE1.

According to an exemplary embodiment of the inventive concept, the first metal and the second metal may be made of substantially the same material. For example, the first metal and the second metal may be formed of substantially the same material even if they are disposed on different layers.

However, the inventive concept is not limited thereto. For example, in exemplary embodiments of the inventive concept, the first metal and the second metal may include different materials from each other.

The power line PL may be made of a material having a low resistance to prevent deterioration in image quality due to IR drop.

For example, the source/drain metal may be selected with priority given to low resistivity conditions, and may be made of a material with a lower resistance than metals forming the first and/or second gate electrodes GE1 and GE2.

A third insulating film PSV may be provided on the second conductive layer. According to an exemplary embodiment of the inventive concept, the third insulating film PSV may include a passivation film and/or a planarizing film.

The first source electrode SE1 may be connected to the first source region of the first active pattern ACT1 through the first contact hole CH1.

The first drain electrode DE1 may be connected to the first drain region of the first active pattern ACT1 through the second contact hole CH2.

According to an exemplary embodiment of the inventive concept, the first contact hole CH1 and the second contact hole CH2 may be formed of substantially the same material as the first source electrode SE1 and the first drain electrode DE1.

According to an exemplary embodiment of the inventive concept, at least one dummy hole DH may be disposed adjacent to the first transistor T1. For example, the at least one dummy hole DH may be disposed adjacent to the first active pattern ACT1 of the first transistor T1. In particular, the at least one dummy hole DH may be disposed adjacent to the first channel region CAE The at least one dummy hole DH may be designed to penetrate at least one of the first insulating film IL1 and the second insulating film IL2.

The at least one dummy hole DH may be formed of a predetermined third metal. According to an exemplary embodiment of the inventive concept, the third metal may be, but is not limited to, one of the metals previously presented as an example of the first metal. For example, the at least one dummy hole DH may be formed of substantially the same material as at least one of the first source electrode SE1 and the first drain electrode DEE The organic light emitting diode OLED may include a first electrode AD, a second electrode CD, and an light emission layer EML provided between the first electrode AD and the second electrode CD.

The first electrode AD may be provided in a light emission region corresponding to each pixel PXL. The first electrode AD may be connected to the first drain electrode DE1 of the first transistor T1 through the third contact hole CH3.

According to an exemplary embodiment of the inventive concept, a pixel defining layer PDL for partitioning the light emission region to correspond to each pixel PXL may be provided on the substrate SUB on which the first electrode AD and the like are disposed.

The pixel defining layer PDL may expose an upper surface of the first electrode AD and protrude from the substrate SUB along the periphery of the pixel PXL.

The light emission layer EML may be provided in the light emission region surrounded by the pixel defining layer PDL, and the second electrode CD may be provided on the light emission layer EML.

According to an exemplary embodiment of the inventive concept, a sealing film SLM covering the second electrode CD may be provided on the second electrode CD.

According to an exemplary embodiment of the inventive concept, one of the first electrode AD and the second electrode CD may be an anode electrode and the other may be a cathode electrode. For example, the first electrode AD may be an anode electrode, and the second electrode CD may be a cathode electrode.

The light emission layer EML may be disposed on an exposed surface of the first electrode AD.

According to an exemplary embodiment of the inventive concept, the light emission layer EML may have a multilayer thin film structure including at least a light generation layer LGL.

According to an exemplary embodiment of the inventive concept, the color of light generated in the light generation layer LGL may be one of red, green, and blue, but the inventive concept is not limited thereto. For example, the color of light generated in the light generation layer LGL of the light emission layer EML may be one of magenta, cyan, and yellow.

According to an exemplary embodiment of the inventive concept, the sealing film SLM may prevent oxygen and moisture from penetrating into the organic light emitting diode OLED.

For this purpose, the sealing film SLM may comprise an inorganic film. The inorganic film may include at least one of silicon oxide, silicon nitride, silicon oxynitride, aluminum oxide, titanium oxide, zirconium oxide, or tin oxide.

Figure 6A:
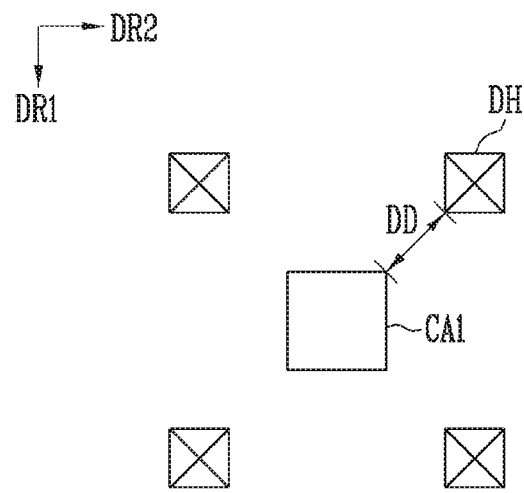
FIGS. 6A and 6B are diagrams illustrating an arrangement of dummy holes according to exemplary embodiments of the inventive concept.
Figure 6B:
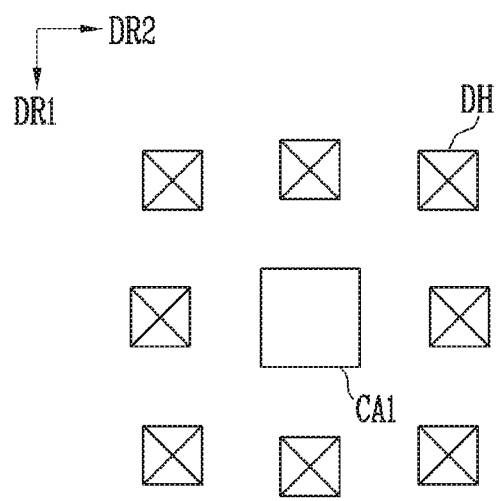

FIGS. 6A and 6B are diagrams illustrating an arrangement of dummy holes according to exemplary embodiments of the inventive concept.

In FIG. 6A, four dummy holes DH are shown as being disposed adjacent to the first channel region CA1 for convenience of explanation, but the inventive concept is not limited thereto.

Referring to FIG. 6A, the dummy holes DH may be disposed adjacent to the first channel region CAL For example, the dummy holes DH may be spaced apart from the first channel region CA1 by a dummy interval DD.

When the dummy interval DD is 0, the dummy holes DH may contact the first channel region CAL According to an exemplary embodiment of the inventive concept, the dummy interval DD may be designed differently for each dummy hole DH. Additionally, according to an exemplary embodiment of the inventive concept, the dummy interval DD may be designed to be substantially the same for each dummy hole DH.

In FIG. 6B, eight dummy holes DH are shown disposed adjacent to the first channel region CA1 for convenience of explanation, but the inventive concept is not limited thereto.

Referring to FIG. 6B, the number of dummy holes DH may be eight, unlike FIG. 6A. In other words, according to an exemplary embodiment of the inventive concept, the number of dummy holes DH may be designed variously. For example, the number of dummy holes DH may be designed to be 6 or more and 10 or less.

Figure 7:
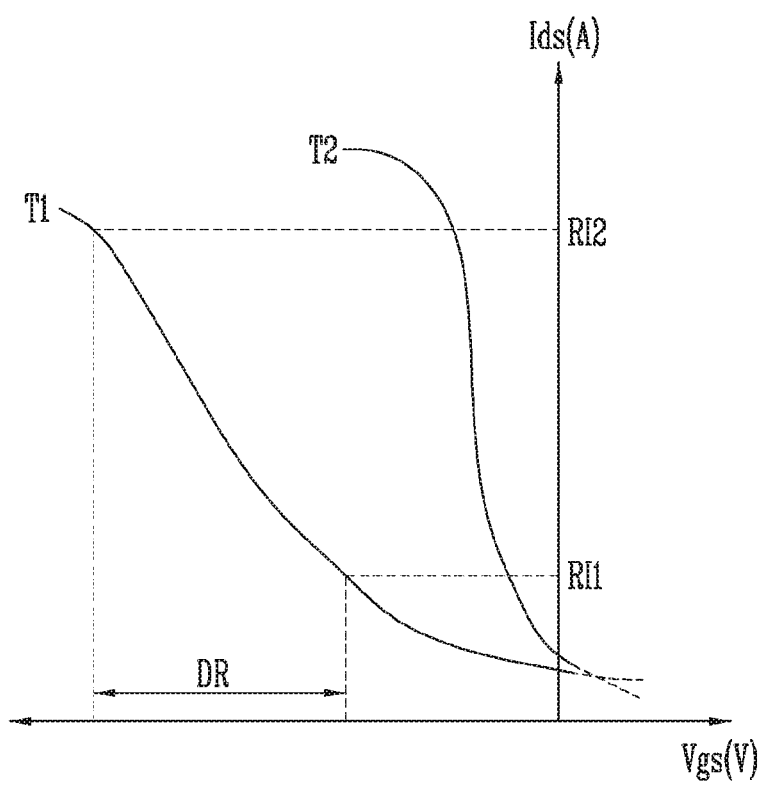
FIG. 7 is a diagram illustrating characteristics of a transistor according to an exemplary embodiment of the inventive concept.

FIG. 7 is a diagram illustrating characteristics of a transistor according to an exemplary embodiment of the inventive concept.

Referring to FIG. 7, the characteristics of the driving transistor T1 and the switching transistor T2 are shown.

The switching transistor T2 may have a small S-factor for a fast driving speed. On the other hand, the driving transistor T1 may have a relatively large S-factor to reduce the luminance deviation due to the scattering of the gate voltage.

The term "S-factor" is a current-voltage characteristic of a thin film transistor, which refers to a magnitude of a gate voltage required to increase a drain current (e.g., Ids) by a factor of 10 when a gate voltage (e.g., Vgs) of less than a threshold voltage is applied. The S-factor is commonly referred to as the subthreshold slope.

Additionally, the driving transistor T2 may have a small driving range for a fast driving speed. However, the driving transistor T1 may have a relatively large driving range to reduce the luminance deviation due to the scattering of the gate voltage.

The term "driving range" is a characteristic of a thin film transistor, and refers to a voltage range necessary to change the drain current from a first reference current RI1 to a second reference current RI2 when a gate voltage less than or equal to the threshold voltage is applied.

Accordingly, referring to FIG. 7, the S-factor of the switching transistor T2 according to an exemplary embodiment of the inventive concept may be smaller than the S-factor of the driving transistor T1. Additionally, the driving range of the switching transistor T2 according to an exemplary embodiment of the inventive concept may be smaller than a driving range DR of the driving transistor T1.

Figure 8A:
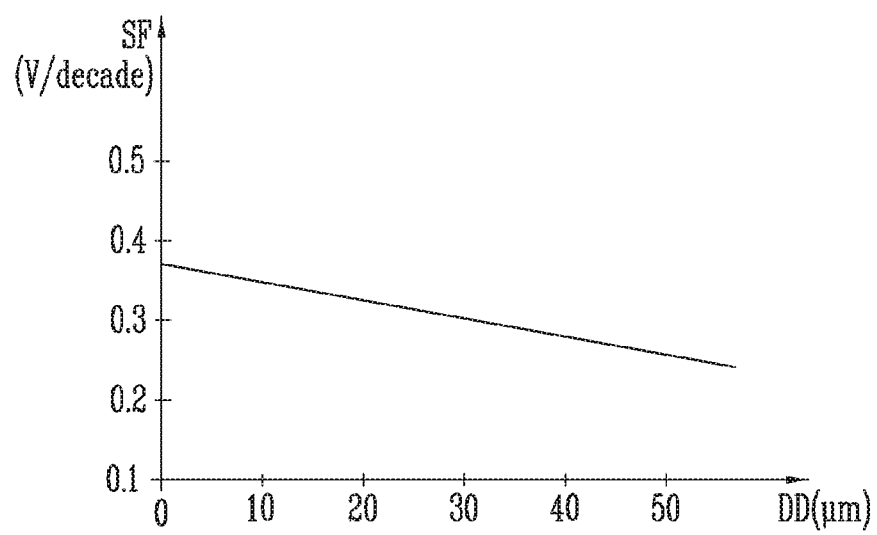
FIGS. 8A and 8B are diagrams illustrating characteristics of a driving transistor according to exemplary embodiments of the inventive concept.
Figure 8B:
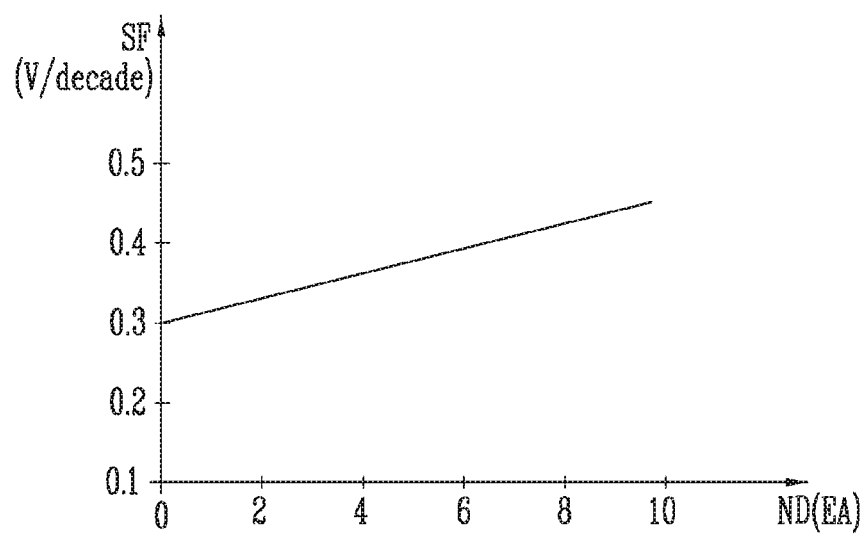

FIGS. 8A and 8B are diagrams illustrating characteristics of a driving transistor according to exemplary embodiments of the inventive concept.

In FIG. 8A, an S-factor SF according to the dummy interval DD is shown. In FIG. 8B, the S-factor SF according to a number ND of the dummy holes DH is shown.

Referring to FIG. 8A, as the dummy interval DD increases, the S-factor SF of the driving transistor according to an exemplary embodiment of the inventive concept decreases. In other words, as the dummy interval DD decreases, the characteristics of the driving transistor may be further improved.

Referring to FIG. 8B, as the number ND of the dummy holes DH increases, the S-factor SF of the driving transistor according to an exemplary embodiment of the inventive concept increases. In other words, as the number ND of the dummy holes DH increases, the characteristics of the driving transistor may be further improved.

Figure 9A:
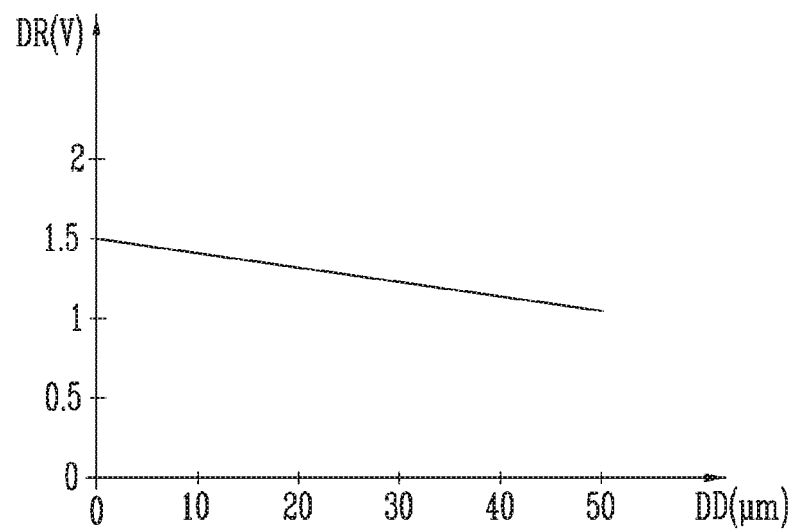
FIGS. 9A and 9B are diagrams illustrating characteristics of a driving transistor according to exemplary embodiments of the inventive concept.
Figure 9B:
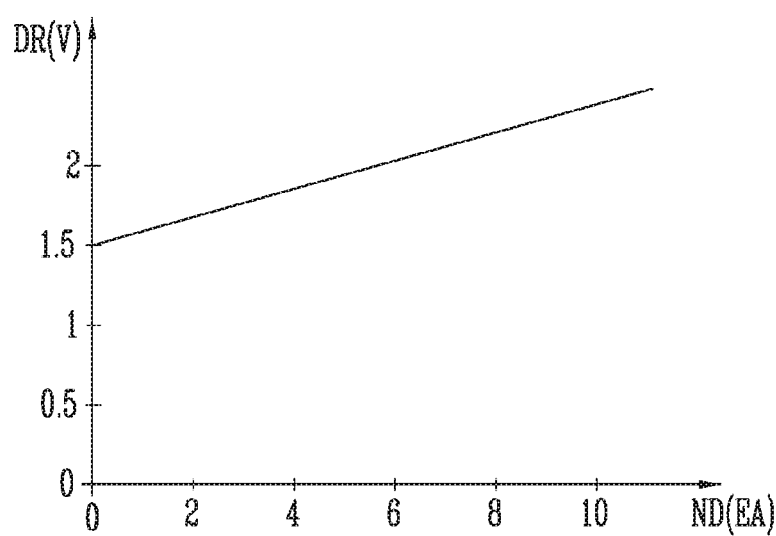

FIGS. 9A and 9B are diagrams illustrating characteristics of a driving transistor according to exemplary embodiments of the inventive concept.

In FIG. 9A, the driving range DR according to the dummy interval DD is shown. In FIG. 9B, the driving range DR according to the number ND of the dummy holes DH is shown.

Referring to FIG. 9A, as the dummy interval DD increases, the driving range DR of the driving transistor according to an exemplary embodiment of the inventive concept decreases. In other words, as the dummy interval DD decreases, the characteristics of the driving transistor may be further improved.

Referring to FIG. 9B, as the number ND of the dummy holes DH increases, the driving range DR of the driving transistor according to an exemplary embodiment of the inventive concept increases. In other words, as the number ND of the dummy holes DH increases, the characteristics of the driving transistor may be further improved.

According to exemplary embodiments of the inventive concept, the transistor substrate and the display device including the transistor substrate may improve the characteristics of the driving transistor.

In addition, according to exemplary embodiments of the inventive concept, the transistor substrate and the display device including the transistor substrate may increase the S-factor of the driving transistor.

Further, according to exemplary embodiments of the inventive concept, the transistor substrate and the display device including the transistor substrate may increase the driving range of the driving transistor.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A transistor substrate comprising:
 a base substrate; and
 a switching transistor and a driving transistor provided on the base substrate,
 wherein the driving transistor includes:
 an active pattern provided on the base substrate and including a source region, a drain region spaced apart from the source region, and a channel region provided between the source region and the drain region;
 a gate electrode at least partially overlapping the active pattern;
 a gate insulating film provided between the active pattern and the gate electrode;
 a source electrode insulated from the gate electrode and connected to the source region;
 a drain electrode insulated from the gate electrode and connected to the drain region; and
 at least one dummy hole adjacent to the channel region,
 wherein the at least one dummy hole is spaced apart from the channel region by a dummy interval, and the dummy interval is a distance between the channel region and the at least one dummy hole, and
 wherein as the dummy interval decreases an S-factor of the driving transistor increases.

2. The transistor substrate of claim 1,
 wherein the driving transistor further includes a first insulating film disposed on the gate electrode, and
 wherein the at least one dummy hole penetrates at least one of the gate insulating film and the first insulating film.

3. The transistor substrate of claim 1,
 wherein the at least one dummy hole includes at least two dummy holes, and
 wherein the dummy interval is different for each of the at least two dummy holes.

4. The transistor substrate of claim 1,
 wherein the at least one dummy hole includes at least two dummy holes, and
 wherein the dummy interval is the same for each of the at least two dummy holes.

5. The transistor substrate of claim 1,
 wherein as a number of the at least one dummy hole increases, an S-factor of the driving transistor increases.

6. The transistor substrate of claim 1,
 wherein the at least one dummy hole is formed of substantially the same material as at least one of the source electrode and the drain electrode.

7. A display device comprising:
 an organic light emitting diode;
 a driving transistor configured to control an amount of current supplied to the organic light emitting diode;
 a switching transistor configured to transmit a data signal to the driving transistor; and
 at least one dummy hole,
 wherein the at least one dummy hole is disposed adjacent to the driving transistor, and
 wherein as a number of the at least one dummy hole increases, an S-factor of the driving transistor increases.

8. The display device of claim 7,
 wherein the driving transistor includes:
 an active pattern disposed on a substrate and including a source region, a drain region, and a channel region;
 a gate electrode overlapping the channel region; and
 a gate insulating film disposed between the active pattern and the gate electrode.

9. The display device of claim 8,
 wherein the driving transistor further includes a first insulating film disposed on the gate electrode, and
 wherein the at least one dummy hole penetrates at least one of the gate insulating film and the first insulating film.

10. The display device of claim 8,
 wherein the at least one dummy hole is spaced apart from the channel region by a dummy interval, and the dummy interval is a distance between the channel region and the at least one dummy hole.

11. The display device of claim 10,
 wherein the at least one dummy hole includes at least two dummy holes, and
 wherein the dummy interval is different for each of the at least two dummy holes.

12. The display device of claim 10,
 wherein the at least one dummy hole includes at least two dummy holes, and
 wherein the dummy interval is the same for each of the at least two dummy holes.

13. A transistor substrate comprising:
 a base substrate;
 a first transistor provided on the base substrate and comprising a first gate electrode, a first active pattern, a first source electrode, and a first drain electrode, wherein the first active pattern contacts the base substrate;

a first insulating film provided between the first active pattern and the first gate electrode; and a second insulating film provided on the first gate electrode, wherein at least one dummy hole is provided adjacent to the first transistor and penetrates the first insulating film and the second insulating film; and wherein the at least one dummy hole is formed of substantially the same material as at least one of the first source electrode and the first drain electrode.

14. The transistor substrate of claim 13, further comprising a third insulating film provided on the first source electrode and the first drain electrode, wherein the third insulating film is a passivation film or a planarizing film.

15. The transistor substrate of claim 14, further comprising:

an organic light emitting diode provided on the third insulating film and comprising a first electrode, a second electrode, and a light emission layer provided between the first electrode and the second electrode.

16. The transistor substrate of claim 13, wherein the first active pattern comprises a first channel region, a first source region, and a first drain region, and wherein the at least one dummy hole is spaced apart from the first channel region by a dummy interval that is a distance between the first channel region and the at least one dummy hole.

17. The transistor substrate of claim 13, further comprising a second transistor, wherein the first transistor is a driving transistor and the second transistor is a switching transistor, and wherein the at least one dummy hole is provided closer to the first transistor than the second transistor.

18. The transistor substrate of claim 17, wherein an S-factor of the first transistor is greater than an S-factor of the second transistor.

* * * * *